United States Patent [19]

Nishida et al.

[11] Patent Number: 4,908,681
[45] Date of Patent: Mar. 13, 1990

[54] INSULATED GATE FIELD EFFECT TRANSISTOR WITH BURIED LAYER

[75] Inventors: Masanori Nishida, Ota; Masashige Aoyama; Hiroshi Onodera, both of Gunma, all of Japan

[73] Assignee: Sanyo Electric Co., Ltd., Moriguchi, Japan

[21] Appl. No.: 265,338

[22] Filed: Oct. 27, 1988

Related U.S. Application Data

[63] Continuation of Ser. No. 569,926, Jan. 11, 1984, abandoned, which is a continuation of Ser. No. 258,992, Apr. 30, 1981, abandoned.

[30] Foreign Application Priority Data

Apr. 30, 1980 [JP] Japan ................................. 55-58070

[51] Int. Cl.[4] ...................... H01L 29/78; H01L 29/90
[52] U.S. Cl. ..................................... 357/23.3; 357/13; 357/91; 357/20
[58] Field of Search .................... 357/23.3, 13, 91, 20

[56] References Cited

U.S. PATENT DOCUMENTS

| | | | |
|---|---|---|---|
| 3,653,978 | 4/1972 | Robinson et al. | 357/91 |
| 3,745,425 | 7/1973 | Beale et al. | 357/89 |
| 3,789,504 | 2/1974 | Jaddam | 357/23 D |
| 3,860,454 | 1/1975 | De Witt et al. | 357/91 |
| 3,891,468 | 6/1975 | Ito et al. | 357/91 |
| 4,078,947 | 3/1978 | Johnson et al. | 357/91 |
| 4,132,998 | 1/1979 | Dingwall | 357/235 SC |
| 4,148,046 | 4/1979 | Hendrickson et al. | 357/13 |
| 4,242,691 | 12/1980 | Kotani et al. | 357/235 SC |
| 4,276,555 | 6/1981 | Vinal | 357/13 |
| 4,315,781 | 2/1982 | Henderson | 357/23 D |
| 4,334,235 | 6/1982 | Nishizawa | 357/55 |

FOREIGN PATENT DOCUMENTS 55-55569 4/1980 Japan ..................................... 357/20

OTHER PUBLICATIONS

Konaka et al, "Suppression of Anomalous . . . MOSFET", *Proceedings of the 10th Conf. on Solid State Devices*, Tokyo, 1978, Jap. Jour. of App. Phys., vol. 18 (1979), Suppl. 18-1, pp. 27-33.

Primary Examiner—Andrew J. James
Assistant Examiner—Jerome Jackson, Jr.
Attorney, Agent, or Firm—Armstrong, Nikaido, Marmelstein, Kubovcik & Murray

[57] ABSTRACT

An insulated gate field effect transistor fabricated in one conductivity type semiconductor substrate wherein a source region and a drain region are formed apart each other to define a channel region therebetween, having a deep ion implantation region which is so formed in the lower portion of the channel region that at least one end portion of the depletion region of the channel extends towards the source region beyond the border between the source region and the channel region at the surface of the substrate whereby an imaginary straight line drawn from said border at the surface of the substrate and an intersecting point between the depletion region of the source and the depletion region of the channel region without a back gate bias voltage defines an angle larger than 90° against the surface of the substrate.

4 Claims, 6 Drawing Sheets

INSULATED GATE FIELD EFFECT TRANSISTOR WITH BURIED LAYER

This application is a continuation of application Serial No. 569,926 filed Jan. 11, 1984; which is a continuation of application Ser. No. 258,992 filed Apr. 30, 1981, now abandoned.

FIELD OF THE INVENTION

The present invention relates to an insulated gate field effect transistor (referred to as IGFET hereinafter), and more particularly to an improvement of a short channel IGFET.

BACKGROUND OF THE INVENTION

It is important to minimize the size of the elements in a MOS integrated circuit device to increase the integration density of the device. However, the electrical characteristics of the integrated circuit device become remarkably lower as the deveice size becomes smaller. One of the problems cause by the miniaturization of the device size is reduction of a break down voltage between a source and a drain and another problem is reduction of the threshold voltage. These problems are referred to as short-channel effects because these undesirable phenomena become more remarkable as the device size becomes smaller. The short-channel effect is disclosed in Device Characteristics of Short Channel and Narrow Width MOSFET's by Paul P. Wang, IEEE TRANSACTIONS ON ELECTRON DEVICES, VOL. ED-25, NO. 7, on Pages 779–786, 1978.

According to the literature, in order to reduce the short-channel effect, there is proposed to form an ion implantation layer around the channel region of MOSFET's.

It is well known that a punch through between a source and drain regions in IGFET does not occur on the surface of a substrate in which IGFET's are fabricated but occurs in a relatively deep region in the substrate.

The said deep ion implantation layer serves effectively to increase the break-down voltage. This is apparent from the following experiment.

FIG. 1 shows a schematic cross sectional view of an IGFET used in the experiment.

In FIG. 1, the IGFET comprises a substrate 1 made of P-type semiconductor, a source region 2, a drain region 3 separated from the source region 2 with a given distance, the respective source 2 and drain 3 are formed near the surface of the substrate 1. A gate dioxide layer 4 is disposed on the surface of the substrate 1 opposing to the channel region defined between the source 2 and drain 3; on the gate dioxide layer 4 a gate electrode 5 made of polycrystalline silicon material is formed.

The channel length L shown in FIG. 1 is a distance between the both opposed ends of the source 2 and drain 3 on the surface of substrate 1. FIG. 2 is a characteristic curves showing the relationships between the channel length L on the X axis and the break-down voltage of the drain on the Y axis wherein value of the deep ion implantation is taken as parameters.

It is apparent from FIG. 2, that in the IGFET's without ion implantation layer the break-down voltage of the drain is significantly reduced as the channel length becomes shorter as shown by the dot marks. On the other hand, as shown by the circle or triangular marks, in the ion implanted IGFET's the break-down voltage can be maintained high when the channel length is to 2 to 3 $\mu$m, although there are variations of the break-down voltage depending on the amount of the ion implantation.

From the foregoing, it is understood that in the short channel IGFET's, the deep ion implantation layer serves to improve the break down voltage.

Observation on the threshold voltage of the short channel IGFET's is described hereinafter. It is apparently shown in FIG. 3 by the dot marks that in the conventional IGFET's without deep ion implantation layer, the threshold voltage becomes remarkably low as the channel length becomes shorter. On the other hand, as shown by the circular marks and the triangular marks, in the IGFET with the deep ion implantation layer the channel length dependence of the threshold voltage is improved.

However, in the IGFET's with the deep ion implantation layer, the short-channel effect appears when the channel length is further shortened. The short channel effect of the threshold voltage under the ion implanted IGFET's has only been described in the transaction of International Electron Device Meeting, 1978 on pages 468 to 471 by Yeh et al.

The technique of the deep ion implantation has been adopted to improve the break-down voltage in the short channel IGFET's, however, so far as the threshold voltage is concerned, the effect of the deep ion implantation technique has been merely incidentally discussed.

As understood from the foregoing the conventional IGFET's having the ion implantation layer around the channel region show such a drawback that the short channel effect, particularly the reduction of the threshold voltage due to the reduction of the channel length (referred to as a channel length dependence of the threshold voltage) can not be effectively improved thereby resulting in preventing the integrated circuit device size from minitiralizing to the desired value.

SUMMARY OF THE INVENTION

Accordingly, an essential object of the present invention is to provide an IGFET which maintains the threshold voltage at a desired value regardless of reduction of the channel length.

Another object of the present invention is to provide IGFET's which can be manufactured with a high device device.

According to the present invention, there is provided an IGFET fabricated in one conductivity type semiconductor substrate wherein a source region and a drain region are formed apart each other to define a channel region therebetween, having a deep ion implanted region which is so formed in the lower portion of the channel region that at least one end portion of the depletion region of the channel extends towards the source region beyond the border between the source region and the channel region at the surface of the substrate whereby an imaginary straight line drawn from said border at the surface of the substrate and an intersecting point between the depletion region of the source and the depletion region of the channel region without a back gate bias voltage defines an angle larger than 90° against the surface of the substrate.

DETAILED DESCRIPTION OF THE INVENTION

Figure 1:
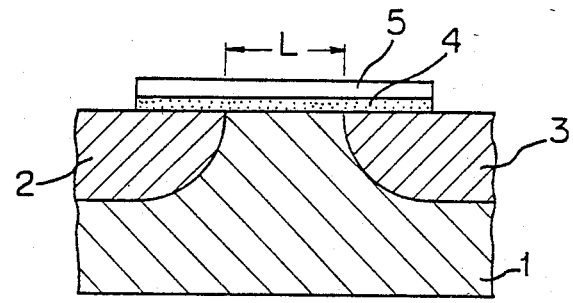
FIG. 1 is a cross sectional view of a conventional IGFET.
Figure 2:
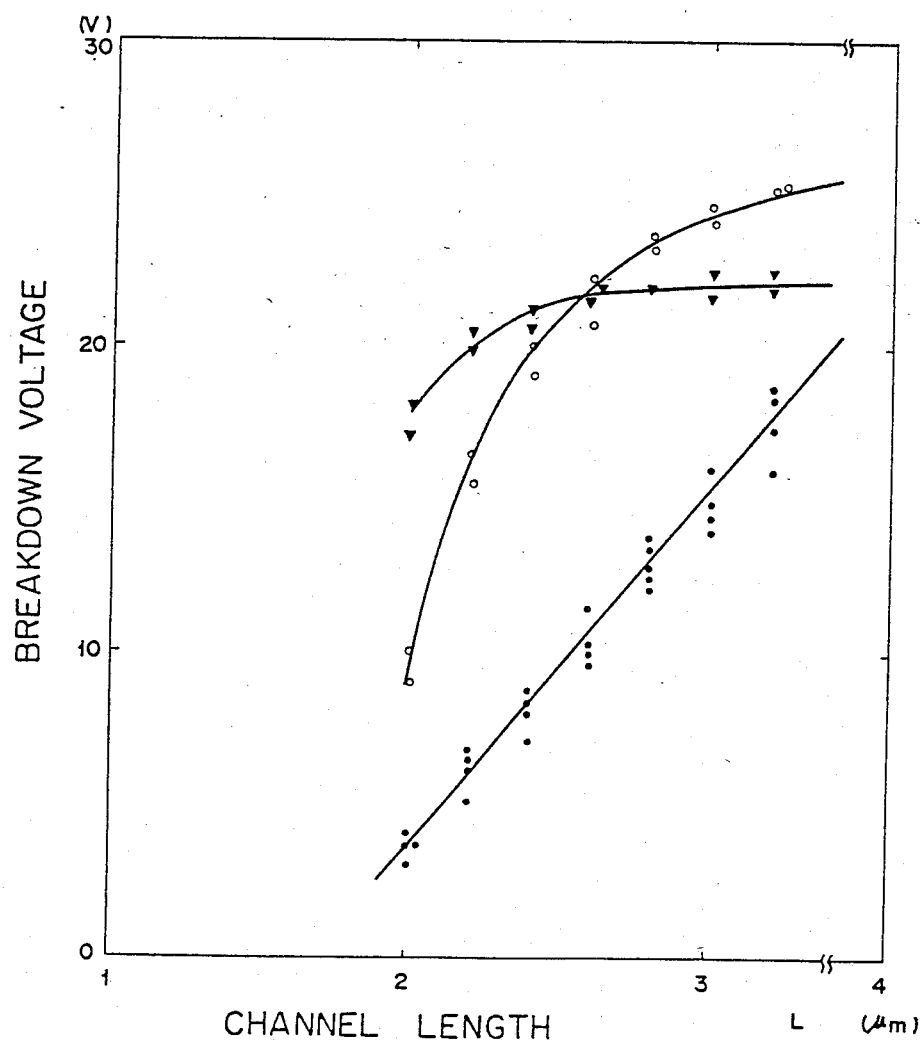
FIG. 2 is a schematic diagram showing the characteristic curves of the relationships between the breakdown voltage and the channel length of the conventional IGFET shown in FIG. 1.
Figure 3:
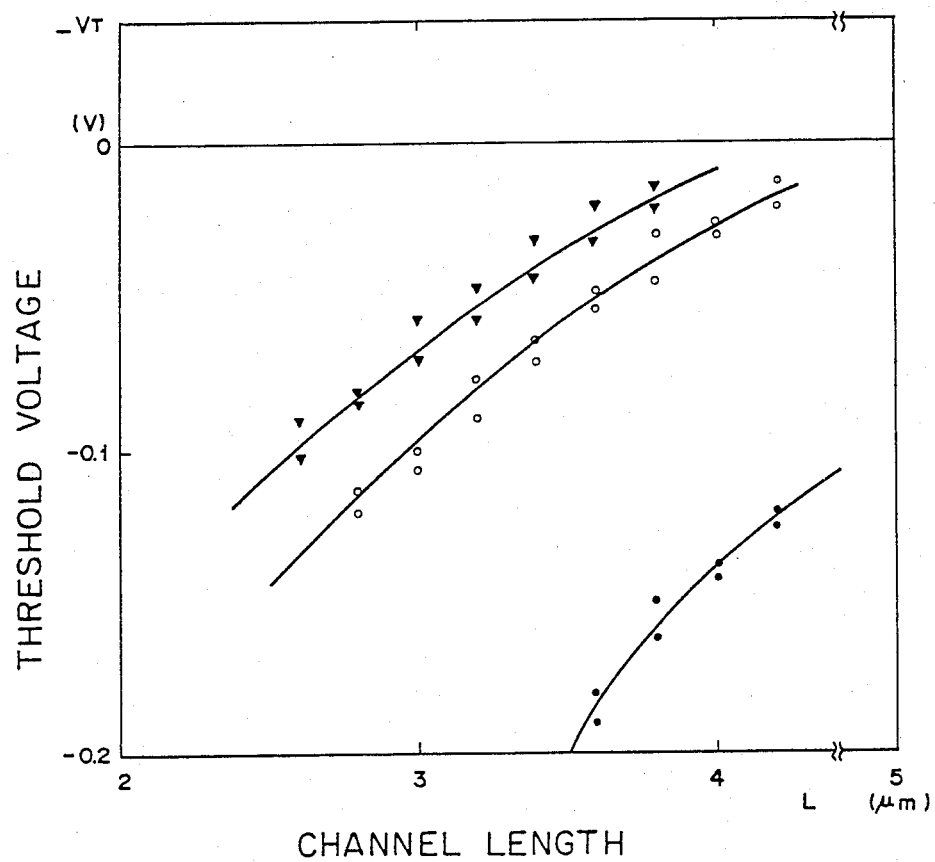
FIG. 3 is a schematic diagram showing the characteristic curves of the relationships between the threshold voltage and the channel length of the IGFET shown in FIG. 1.
Figure 4A:
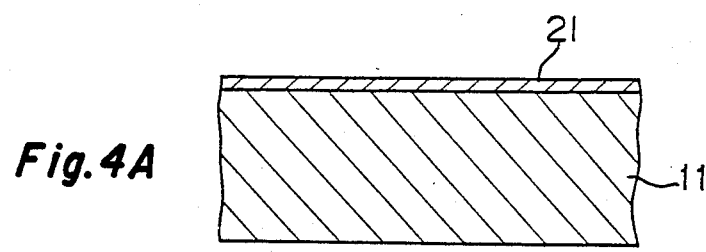
FIGS. 4A to 4E are respectively cross sectional views showing a process of making an IGFET according to the present invention.
Figure 4B:
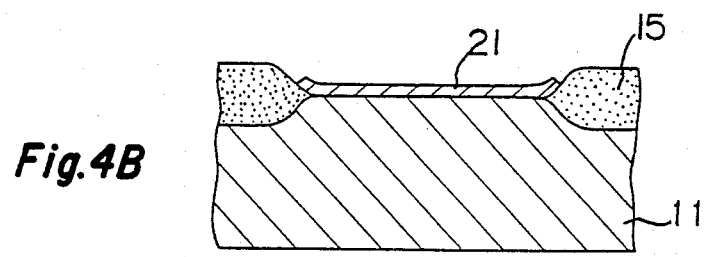
Figure 4C:
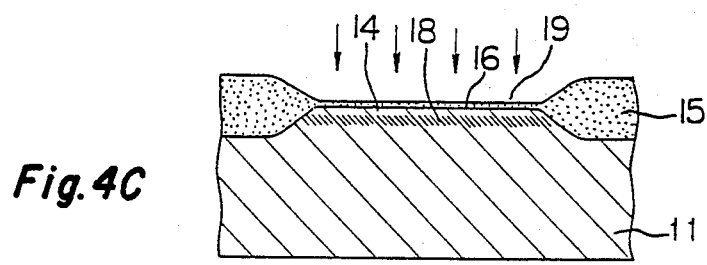
Figure 4D:
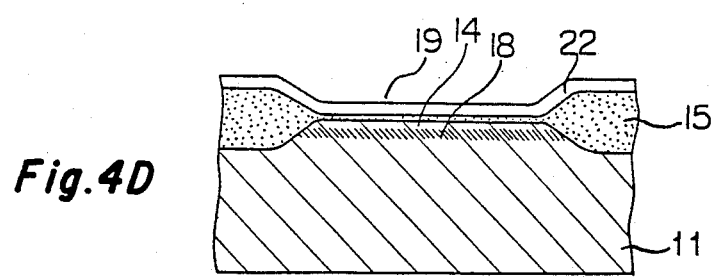
Figure 4E:
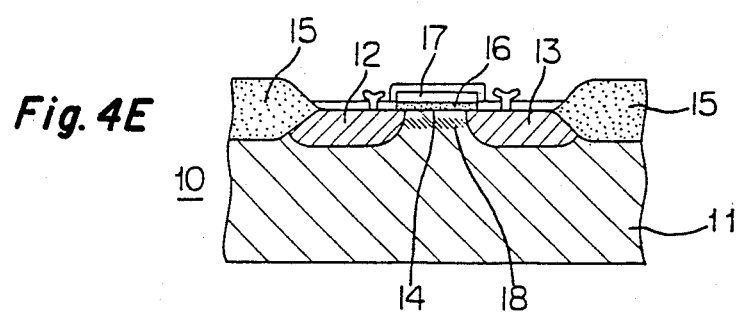

Referring to FIG. 4E, a short channel IGFET 10 according to the present invention includes a substrate 11 made of a silicon semiconductor material of P conductivity type, a source region 12 and a drain region 13 composed of an excessive N+ conductivity type deposited in the surface region of the substrate 11 spaced from each other by a given short distance, a channel region 14 situated between source region 12 and drain region 13, gate insulation oxide layer 16 disposed on the surface of substrate 11 covering the channel region 14 with the both ends of the gate insulation layer terminated above the source region 12 and the drain region 13, and a gate electrode 17 situated above the channel region 14 across the gate insulation oxide layer 16.

Beneath the channel region 14, a deep ion implantation layer 18 of P conductivity type is formed.

According to the present invention, the density of the inpurities in the ion implantation layer 18 is so controlled that the ion implantation layer which has been used to improve the breakdown voltage of drain region serves to reduce the channel length dependence of the threshold voltage, thereby suppressing the undesired effect of the threshold voltage being reduced as the channel length becomes short.

A manufacturing process of the IGFET shown in FIG. 4E will be described with reference to FIGS. 4A through 4E. A P-type conductivity of a silicon substrate 11 of (1 0 0) having a resistivity of 10 Ωcm is used as a semiconductor substrate. A silicon nitride film 21 is formed on one surface region of the substrate 11 for a mask for selectively oxidizing said surface region of the substrate 11. Subsequently, the silicon nitride film 21 is selectively removed by a photo etching in a known manner so that a part of the surface of the substrate 11 is exposed.

Subsequently, the substrate 11 is subjected to an oxidizing process in a steam atmosphere to cause the substrate 11 to be selectively oxidized to form the field oxide film 15 of a thickness of about 1 μm.

Subsequently, the silicon nitride film 21 which was used already as a mask in the previous process is removed by etching, and in turn, as shown in FIG. 4C, on the area thus exposed on the surface of the substrate 11 a gate oxide film 16 of a thickness of about 1000 Å is formed. Then boron ions are implanted into the substrate 11 through a window 19 at 160 KeV to form a deep ion implantation layer 18 beneath the region where the channel region 14 is to be formed, namely in the lower portion of the channel region.

Thereafter, as shown in FIG. 4D, a polycrystalline-silicon film 22 is deposited on the whole surface of the substrate 11, in turn the film 22 except for the region where a gate electrode 17 is to be formed is removed as shown in FIG. 4E by a known manner. Furthermore, the gate oxide film 14 other than a region situated under the polycrystalline-silicon layer 22 is removed by a photo etching. N-type impurities are diffused in the substrate 11 using the gate electrode 17 as a mask to form a source region 12 and the drain region 13 each having an excessive N-type conductivity.

In this embodiment, the source and drain regions 12 and 13 are formed deeper than deep ion implantation layer 18.

The present inventors have studied the relationships between the channel length dependence of the threshold voltage and the deep ion implantation layer.

According to the result of the studies, the following equation $$\Delta V_T = V_T(L) - V_T(L = \infty) = \frac{Q_{sc}(L) - Q_{sc}(L = \infty)}{C_{ox}} = \qquad (1)$$

$$-\frac{2\cot\theta}{L} \cdot \frac{1}{C_{ox}} \cdot K_s \epsilon_0 \{(\phi_{sINV} - \phi_0(x_{d\max})\} - \frac{KT}{q}$$

is obtained to describe the threshold voltage shift relative to the channel length in an IGFET formed in a nonuniformly doped substrate, i.e., a substrate having impurities, the density of which is nonuniformly distributed in the derection of the thickness of the substrate, by modifying the theory of the threshold voltage change described by L. D. Yau on pages 1059 to 1063 in [A SIMPLE THEORY TO PREDICT THE THRESHOLD VOLTAGE OF SHORT CHANNEL IGFETs] Solid-State Electronics, vol 17, 1974 of an IGFET formed in a uniformly doped substrate i.e., a substrate having impurities, the density of which is uniformly distributed in the direction of the thickness of the substrate.

In the equation (1)

Figure 5:
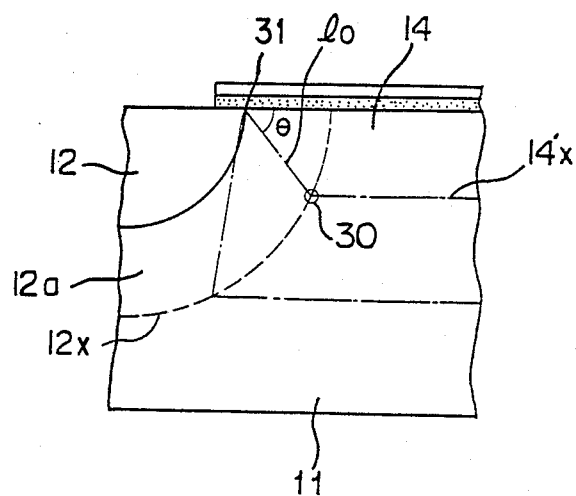
FIG. 5 is a cross sectional view showing a conventional IGFET used for an explanation of a structure analysis.
Figure 6:
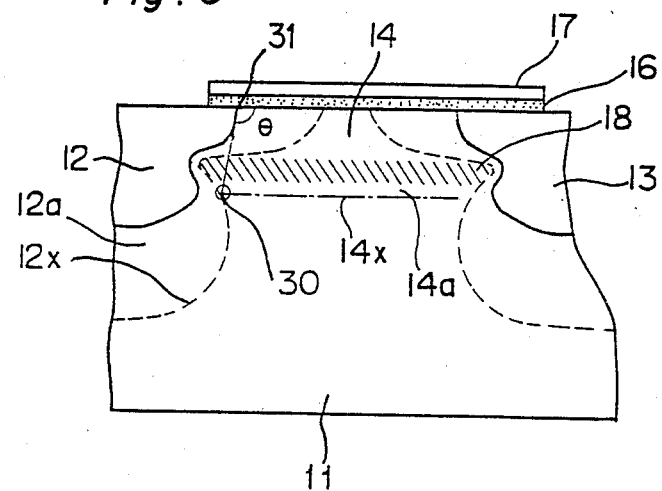
FIG. 6 is a cross sectional view showing an IGFET according to the present invention used for an explanation of a structure analysis.

$V_T(L)$ is a threshold voltage of IGFET with channel length L, $V_T(L=\infty)$ is a threshold voltage of a long channel IGFET $Q_{sc}$ is a space charge density per unit surface area induced by a gate applied bias, $\theta$ is an angle defined by the surface of the substrate in which the IGFET is fabricated and an imaginary straight line $l_0$, drawn from a a boundary of the source region on the surface of the device and an intersecting point 30 between the end 12 of the depletion region 12a of the source 12 and the end 14x of the depletion region 14a of the channel region 14 as shown in FIGS. 5 or 6, $\phi_{sINV}$ is a potential on the surface of the channel region at the onset of heavy inversion, $\phi_0(X_{d\max})$ is a potential on the gate depletion boundary 14x of the channel region 14, $C_{ox}$ is a capacitance per unit area of the gate insulator film, $\epsilon_0$ is the permittivity of free space, $K_s$ is the dielectric constant of the substrate material and $kT/q$ is a thermal voltage.

Observing the equation (1), the respective items other than the item of $-2 \cot \theta/L$ can be decided depending on the construction of the long channel IGFET's, so that in order to decrease the effect of the channel length dependence of the IGFET's, only ways are to cause the value of the item $-2 \cot \theta/L$ to be either small in a negative value or to be a positive value.

It can not be adopted in the short channel IGFET's to enlarge the channel length L to decrease the value of the item $2 \cot \theta/L$, therefore, the present inventors noticed that it is necessary to make the value $\cot \theta$ negative in order to decrease the channel length dependency of IGFET's.

FIG. 5 is a schematic diagram showing a geometrical model of a conventional IGFET with the uniformly doped substrate and FIG. 6 is a schematic diagram showing a geometrical model of an IGFET according to the present invention fabricated in the nonuniformly doped substrate.

FIG. 5 shows only the source region of the IGFET since the structure therof is symmetrical in a lateral direction with reference to the channel portion.

In both of the drawings of FIGS. 5 and 6, a dotted lines 12x denotes source depletion boundary of the source 12, and a dotted line 14x denotes gate depletion boundary of the depletion region 14a introduced by the gate applied bias in a case where the back gate bias is not applied.

As shown apparently in FIG. 5 the source depletion boundary 12x of the depletion region 12a of the source 12 in the conventional IGFET is formed in an arcuate configuration without irregularity. The source depletion boundary 12x of the depletion region 12a and the gate depletion boundary 14x of the depletion region 14a near the source 12 interact at a point 30 so that the angle $\theta$ defined by the surface of the substrate 11 and the straight line $l_O$ connecting the point 31 at the source region boundary at the surface of the substrate and the intersecting point 30 is smaller than 90°.

On the contrary, according to one embodiment of the present invention, the source region 12 is recessed in an intermediate portion in a direction parallel to the surface of the substrate due to the deep ion implantation layer 18 as shown in FIG. 6, so that the intersection point 30 between the source depletion boundary 12x of the depletion region 12a of the source 12 and the gate depletion boundary 14x of the depletion region 14a of the channel 14 is displaced towards the source region 12 beyond the peripheral edge of the source region 12 on the surface of the substrate 11. In other words, the deep ion implantation layer 18 is formed in the lower portion of said channel region 14 with a portion of the depletion region 12a of the source region 12 consequently recessed inwardly of the source region 12 by the deep ion implantation layer 18, the angle $\theta$ which is formed between the surface of the substrate on the channel side and an imaginary straight line $l_O$ drawn from the point 31 of junction of the source 12 to the channel 14 at the surface of the substrate 11 to the point 30 of intersection between the source depletion boundary 12X of the depletion region 12a of the source 12 and the gate depletion boundary 14X of the depletion region 14a of the channel region 14 during the absence of the backgate voltage being greater than 90°, resulting in decreasing the value of the item $2 \cot \theta/L$.

Thus, according to the equation (1), the short channel effect associated with threshold voltage can be effectively decreased.

A generally similar recessed portion can be formed in the drain region 13 by the deep ion implantation layer as shown in FIG. 6.

EXAMPLE 1

A substrate of P type having a density of impurity of $2.4 \times 10^{15}$ cm$^{-3}$ is used. A gate oxide layer of a thickness of 1000 Å is formed on the substrate 11.

Other various dimensions and the construction are identical with those shown in FIG. 4E.

Figure 7:
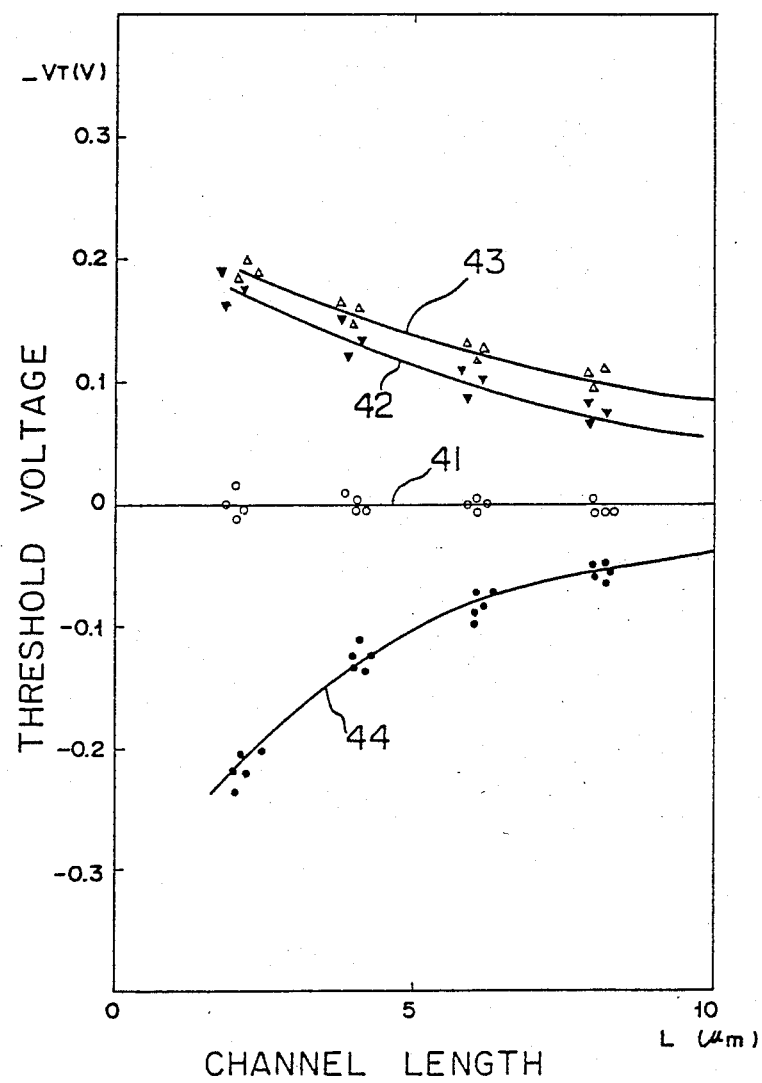
FIG. 7 is a schematic diagram showing the characteristic curves of the relationships between the threshold voltage and the channel length of the IGFET according to the present invention with the characteristic curve of the conventional IGFET attached.

The relationship between the threshold voltage shift $\Delta V_t$ and the channel length is shown in FIG. 7 wherein the curve 41 plotted by the circular marks and the curves 42 and 43 plotted by the triangular marks illustrate the typical characteristics of the IGFET according to the present invention and the curve 44 of the conventional IGFET is illustrated as reference. The curve 41, corresponds to the IGFET having a deep ion implantation layer in which an implantation dose of $1.0 \times 10^{12}$ cm$^{-2}$ is implanted and the curves 42 and 43 show the characteristics of the IGFET having the ion implantation layers in which the implantation doses of $1.5 \times 10^{12}$ cm$^{-2}$ and $2.0 \times 10^{12}$ cm$^{-2}$ are implanted respectively.

According to the characteristic curves shown in FIG. 7, it is recognized that when the implantation dose is higher than $1.0 \times 10^{12}$ cm$^{-2}$, the threshold voltage $\Delta V_t$ increases monotonically as the channel length is shorter. The result of the experiment shown in FIG. 7 proves that the equation (1) introduced by the inventors is correct.

Figure 8:
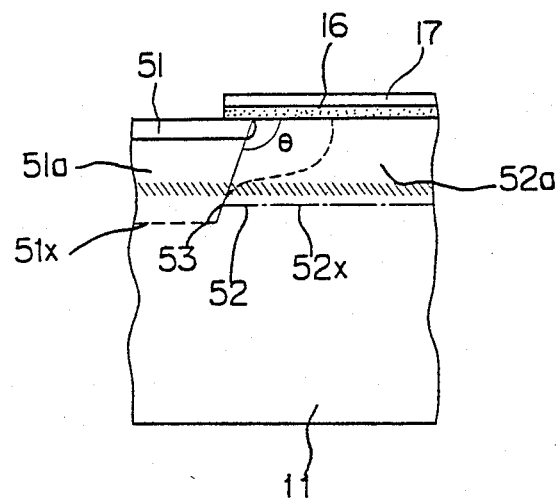
FIG. 8 is a cross sectional view showing an IGFET of another embodiment of the present invention.

Another embodiment of the IGFET according to the present invention is shown in FIG. 8 wherein the source region 51 is formed in the level shallower than the deep ion implantation layer 52 so that the intersecting point 53 between the boundary 51x of the depletion region 51a of the source 51 and the boundary 52x of the depletion region 52a of the channel region 52 is situated at a position displaced towards the source region away from the boundary between the source region and the channel region so that the angle $\theta$ becomes larger than 90°.

In this embodiment, the gate oxide layer 16 and the gate electrode 17 are made in a similar manner as described in the embodiment shown in FIG. 4.

According to the present invention, in order to decrease the variation of the threshold voltage in response to the value of the back gate bias, preferably the highest density region in the ion implanted layer is formed in a level shallower than the level of a maximum surface depletion layer of the channel region without back gate bias.

What is claimed is:

1. A short channel insulated gate field effect transistor having a deep ion implantation layer, said transistor comprising:
   (a) a substrate of semiconductor material of a first conductivity type, having a major surface;
   (b) a source region of a second conductivity type opposite in polarity to the first conductivity type, the source region being formed in and extending under the major surface;
   (c) a drain region of the second conductivity type, formed in and extending under the major surface, the drain region being separated from the source region by the substrate material;

(d) a channel region in the substrate situated between the source and drain regions, the channel region comprising a gate depletion region and a channel layer, wherein current flows through the channel layer;

(e) a gate electrode positioned above the channel region and extending on a gate insulator film formed on the major surface of at least the channel region;

(f) a source depletion layer and said gate depletion layer being formed in the substrate by the electric fields of the source region and the gate electrode;

(g) a source depletion boundary defined between the substrate and the source depletion layer in the absence of a back gate voltage on the substrate;

(h) a gate depletion boundary defined between the substrate and maximum depletion layer formed in the substrate in the absence of the back gate voltage; and (i) a deep ion implanted layer of the first conductivity type formed in a deep portion of the channel region, wherein the gate depletion boundary is located in the deep ion implanted layer and the density of the deep ion implanted layer is such that a recessed portion is defined in the source depletion boundary, the recessed portion extending towards the source region;

(j) wherein the angle $\theta$ formed between the surface of the substrate and an imaginary line extending from the junction of the source region and the channel region on the surface of the substrate to the intersection of the gate depletion boundary and the source depletion boundary is greater than 90° whereby the intersection of the gate depletion boundary and the source depletion boundary is displaced towards the source side of an imaginary line perpendicular to the major surface, the imaginary line passing through the junction of the source region and the channel region on the surface of the substrate.

2. The insulated gate field effect transistor according to claim 1, wherein a middle portion of said deep ion implantation layer is formed at a level shallower than the lowest point of the gate depletion boundary.

3. The insulated gate field effect transistor according to claim 1, wherein said deep ion implantation layer in the channel region has a depth deeper than the depth of the source region.

4. The insulated gate effect transistor according to claim 1, wherein said deep ion implantation layer in the channel region has a depth shallower than the depth of the source region.

* * * * *